United States Patent
Cooke et al.

(10) Patent No.: US 9,917,225 B2
(45) Date of Patent: Mar. 13, 2018

(54) BLACK BODY INFRARED ANTENNA ARRAY

(71) Applicant: NovaSolix, Inc., Palo Alto, CA (US)

(72) Inventors: Laurence H. Cooke, Los Gatos, CA (US); William J. Allen, Cupertino, CA (US)

(73) Assignee: NovaSolix, Inc., San Jose, CA (US)

( * ) Notice: Subject to any disclaimer, the term of this patent is extended or adjusted under 35 U.S.C. 154(b) by 1 day.

(21) Appl. No.: 14/871,958

(22) Filed: Sep. 30, 2015

(65) Prior Publication Data

US 2016/0027949 A1     Jan. 28, 2016

Related U.S. Application Data

(63) Continuation-in-part of application No. 14/701,765, filed on May 1, 2015, which is a continuation-in-part
(Continued)

(51) Int. Cl.
| | |
|---|---|
| H01L 31/042 | (2014.01) |
| H02N 6/00 | (2006.01) |
| H01L 31/054 | (2014.01) |
| H01L 31/052 | (2014.01) |
| H01L 31/0352 | (2006.01) |
| H01L 31/108 | (2006.01) |

(Continued)

(52) U.S. Cl.
CPC .. *H01L 31/0543* (2014.12); *H01L 31/035209* (2013.01); *H01L 31/0475* (2014.12); *H01L 31/052* (2013.01); *H01L 31/108* (2013.01); *H01Q 1/248* (2013.01); *H02S 40/22* (2014.12); *Y02E 10/52* (2013.01)

(58) Field of Classification Search
CPC ............. H01L 31/0543; H01L 31/0475; H01L 31/108; H01L 31/035209; H01L 31/052; H01Q 1/248; H02S 40/22; Y02E 10/52
See application file for complete search history.

(56) References Cited

U.S. PATENT DOCUMENTS

| | | |
|---|---|---|
| 5,043,739 A | 8/1991 | Logan et al. |
| 7,354,877 B2 | 4/2008 | Rosenberger et al. |

(Continued)

FOREIGN PATENT DOCUMENTS

WO    WO 2014063149 A1 *   4/2014   ......... H01L 51/0048

OTHER PUBLICATIONS

Collinear—Definition and More from the Free Merriam-Webster Dictionary, "http://www.merriam-webster.com/dictionary/collinear", 2014.

(Continued)

*Primary Examiner* — Angelo Trivisonno
(74) *Attorney, Agent, or Firm* — Panitch Schwarze Belisario & Nadel LLP (57) ABSTRACT

A solar antenna array may comprise an emitter that may convert visible light into black body infrared radiation, and an array of antennas that may capture and convert the black body radiation into electrical power. Methods for constructing the solar antenna array may include using thermal insulation, high-gain low-e glass, and gasses with minimal heat transfer. A black body infrared antenna array may augment the electrical power from a visible light antenna array by converting its waste heat into additional electrical power.

4 Claims, 10 Drawing Sheets

Related U.S. Application Data of application No. 14/582,747, filed on Dec. 24, 2014, which is a continuation-in-part of application No. 13/454,155, filed on Apr. 24, 2012.

(51) Int. Cl.
*H01Q 1/24* (2006.01)
*H02S 40/22* (2014.01)
*H01L 31/0475* (2014.01)

(56) References Cited

U.S. PATENT DOCUMENTS

| | | | |
|---|---|---|---|
| 7,354,977 | B1 | 4/2008 | Woods et al. |
| 7,431,965 | B2 | 10/2008 | Grigorian et al. |
| 7,431,985 | B2 | 10/2008 | Iwama |
| 7,679,057 | B2 | 3/2010 | Gritz et al. |
| 7,679,957 | B2 | 3/2010 | Ma et al. |
| 7,687,160 | B2 | 3/2010 | Winarski |
| 7,744,793 | B2 | 6/2010 | Lemaire et al. |
| 8,137,653 | B1 | 3/2012 | Predtechensky et al. |
| 2004/0085247 | A1* | 5/2004 | Mickle ............... H01Q 1/22 343/701 |
| 2005/0112049 | A1 | 5/2005 | Hofmeister |
| 2005/0214198 | A1 | 9/2005 | Park et al. |
| 2007/0240757 | A1 | 10/2007 | Ren et al. |
| 2009/0128893 | A1* | 5/2009 | McCarthy ........... G02B 5/1861 359/352 |
| 2010/0084475 | A1 | 4/2010 | Hata et al. |
| 2010/0244656 | A1 | 9/2010 | Ito et al. |
| 2010/0263709 | A1 | 10/2010 | Norman et al. |
| 2010/0284086 | A1 | 11/2010 | Novack et al. |
| 2011/0121258 | A1* | 5/2011 | Hanein .............. B82Y 10/00 257/9 |
| 2012/0206085 | A1 | 8/2012 | Stevens |
| 2012/0211063 | A1* | 8/2012 | Lee ................ H01L 31/02244 136/255 |
| 2013/0249771 | A1 | 9/2013 | Kotter et al. |
| 2013/0276861 | A1 | 10/2013 | Cooke |
| 2015/0130692 | A1 | 5/2015 | Cooke |
| 2015/0155396 | A1 | 6/2015 | Cooke et al. |
| 2015/0243817 | A1 | 8/2015 | Cooke et al. |

OTHER PUBLICATIONS

Rows—Definition and More from the Free Merriam-Webster Dictionary, "http://www.merriam-webster.com/dictionary/rows," 2014.

Siciliano et al., "Nano-Rectenna for High Efficiency Direct Conversion of Sunlight to Electricity," presented at 17th World Micromachine Summit, Apr. 26-29, 2011.

M. Williams, "Rice's carbon nanotube fibers outperform copper," at "http://news.rice.edu/2014/02/13/rices-carbon-nanotube-fibers-outperform-copper-2," posted Feb. 13, 2014.

K. Hata, "From Super Growth to DWNT forests, CNT solids, Flexible Transparent CNT films, and Super-Capacitors and Much More," Jun. 19, 2006.

Y. Ma et al., "The production of horizontally aligned single-walled carbon nanotubes," Carbon, 49, pp. 4098-4110, 2011.

M. Kumar, "Chemical Vapor Deposition of Carbon Nanotubes: A Review on Growth Mechanism and Mass Production," Journal of Nanoscience and Nanotechnology, vol. 10, pp. 3739-3758, 2010.

Office Action dated Feb. 11, 2014 in U.S. Appl. No. 13/454,155.

Office Action dated Jun. 27, 2014 in U.S. Appl. No. 13/454,155.

Office Action dated Sep. 26, 2014 in U.S. Appl. No. 13/454,155.

Office Action dated Jan. 13, 2015 in U.S. Appl. No. 13/454,155.

Type—definition of type by The Free Dictionary, downloaded from web page: http://www.thefreedictionary.com/type, Download date: Mar. 9, 2015, original posting date: unknown, 1 page.

Office Action dated Mar. 17, 2015 in U.S. Appl. No. 13/454,155.

Int'l Search Report and Written Opinion dated Aug. 11, 2016 in Int'l Application No. PCT/US16/29336.

Int'l Search Report and Written Opinion dated Apr. 8, 2016 in Int'l Application No. PCT/US15/59852.

Office Action dated Nov. 14, 2016 in U.S. Appl. No. 14/582,747, by Cooke.

Office Action dated Dec. 29, 2016 in U.S. Appl. No. 15/133,807, by Cooke et al.

Int'l Preliminary Report dated Jul. 6, 2017 in PCT Application No. PCT/US2015/059852.

Office Action dated Sep. 22, 2017 in U.S. Appl. No. 13/454,155, by Cooke.

Office Action dated Jun. 8, 2017 in U.S. Appl. No. 14/701,765, by Cooke.

Office Action dated Apr. 5, 2017 in U.S. Appl. No. 14/582,747 by Cooke.

Office Action dated Jul. 3, 2017 in U.S. Appl. No. 15/133,807, by Cooke.

Office Action dated Jul. 27, 2017 in U.S. Appl. No. 15/411,396, by Cooke.

Int'l Search Report and Written Opinion dated Jun. 20, 2017 in Int'l Application No. PCT/US2017/026130.

Office Action dated May 4, 2017 in U.S. Appl. No. 15/249,953, by Cooke.

Office Action dated Mar. 7, 2017 in U.S. Appl. No. 14/701,765, by Cooke.

* cited by examiner

BLACK BODY INFRARED ANTENNA ARRAY

CROSS-REFERENCE TO RELATED APPLICATIONS

This application is a continuation-in-part of U.S. patent application Ser. No. 14/701,765, filed May 1, 2015, which is a continuation-in-part of U.S. patent application Ser. No. 14/582,747, filed Dec. 24, 2014, which is a continuation-in-part of U.S. patent application Ser. No. 13/454,155, filed on Apr. 24, 2012, the contents of which are incorporated by reference herein in their entireties.

FIELD OF ENDEAVOR

Various aspects of this disclosure may pertain to an economical manufacturing process of long wave infrared rectifying antenna arrays for the conversion of solar energy to electricity.

BACKGROUND

Rectifiers for AC to DC conversion of high frequency signals have been well known for decades. A particular type of diode rectifier when coupled to an antenna, called a rectenna, has also been known for decades. More specifically, over 20 years ago, Logan described using an array of rectennas to capture and convert microwaves into electrical energy in U.S. Pat. No. 5,043,739, granted Aug. 27, 1991. However, the dimensions of the antenna limited the frequency until recently, when Gritz, in U.S. Pat. No. 7,679,957, granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity," by Pietro Siciliano of The Institute for Microelectronics and Microsystems IMM-CNR, Lecce (Italy).

Still, the minimum dimensions required for such infrared light rectennas are generally in the microns. While these dimensions can be accomplished by today's masking technology, such processing is typically more expensive than the current solar cell processes, which require much larger dimensions.

Still, as Logan pointed out in U.S. Pat. No. 5,043,739, the efficiency of microwave rectennas can be as high as 40%, more than double that of typical single junction poly-silicon solar cell arrays, and when using metal-oxide-metal (MOM) rectifying diodes, as Pietro suggests, no semiconductor transistors are needed in the array core.

As such, it may be advantageous to be able to utilize the existing processing capability of current semiconductor fabrication without incurring the cost of such manufacturing.

Also, recently, Rice University reported that their researchers created a carbon nanotube (CNT) thread with metallic-like electrical and thermal properties. Furthermore, single-walled carbon nanotube (SWCNT) structures are becoming more manufacturable, as described by Rosenberger et al. in U.S. Pat. No. 7,354,977, granted Apr. 8, 2008. Various forms of continuous CNT growth may have also been contemplated, such as Lemaire et al. repeatedly harvesting a CNT "forest" while it is growing, in U.S. Pat. No. 7,744,793, granted Jun. 29, 2010, and/or put into practice using techniques described by Predtechensky et al. in U.S. Pat. No. 8,137,653, granted Mar. 20, 2012. Grigorian et al. describes continuously pushing a carbon gas through a catalyst backed porous membrane to grow CNTs in U.S. Pat. No. 7,431,985, granted Oct. 7, 2008.

SUMMARY OF VARIOUS EMBODIMENTS

Various embodiments of the invention may relate to structures of rectifying antenna arrays for converting long wavelength infrared into electricity and/or to ways to manufacture such structures, which may utilize self-aligning process steps and molds made using current IC masking techniques to achieve the dimensions required for the antenna connections.

The structure of the antenna array may include an array of carbon nanotube ¼ wavelength antennas connected across V-shaped spaces between power or ground rails by direct metal connections or by metal-oxide-carbon (MoC) diodes or by point contact diodes.

In one embodiment, the power and ground lines may vary in direction, height and taper to allow carbon nanotube antennas connected between them to randomly vary in location, length and direction with means and variances determined by the structure and process. An optimal black body infrared collector may consist of randomly placed ¼ wavelength antennas that may vary from 1 micron to 5 microns in length. The antenna array may be attached to a plastic surface, which may include a large percentage of thin film metal lines beneath the plastic for collecting the electrical energy. The infrared antenna array may include a high-gain low-e glass cover.

In another embodiment, the angle of the power and ground ridges and the thin film metal lines may optimally reflect unconverted infrared back to the antenna array, and unconverted infrared, reflected from the metal lines, may be further reflected back to the array via the high-gain low-e glass.

The glass may consist of multiple layers of low-e glass, and the thin film metal lines may consist of an alloy of one or more of copper, aluminum, silver, and/or other conductive and/or reflective metals.

In another embodiment, an emitter plate, with a given area, may capture visible light transmitted through a similar sized high-gain low-e glass plate, thereafter emitting the solar energy as black body infrared radiation to a larger area of infrared antenna array to balance the electric energy conversion less the heat losses to the external environment with the solar energy input.

The larger area of infrared antenna array may be constructed by folding the array around a plurality of fins protruding from the emitter plate. Alternatively, the infrared antenna array may be composed of two layers sandwiched together with their thin film metal power and ground lines. The emitter assembly may be connected to the thin film metal lines to recycle the waste heat, and the entire structure may be insulated to further minimize the heat loss. Finally, the ratio of the area of the top of the emitter plate to the area of the antenna array may be less than the efficiency of the antenna array.

BRIEF DESCRIPTION OF THE DRAWINGS

Various aspects of this disclosure will now be described in connection with the attached drawings, in which.

DESCRIPTION OF VARIOUS ASPECTS OF THE DISCLOSURE

Various aspects of this disclosure are now described with reference to FIGS. 1-10, it being appreciated that the figures may illustrate the subject matter of various embodiments and may not be to scale or to measure.

Figure 1:
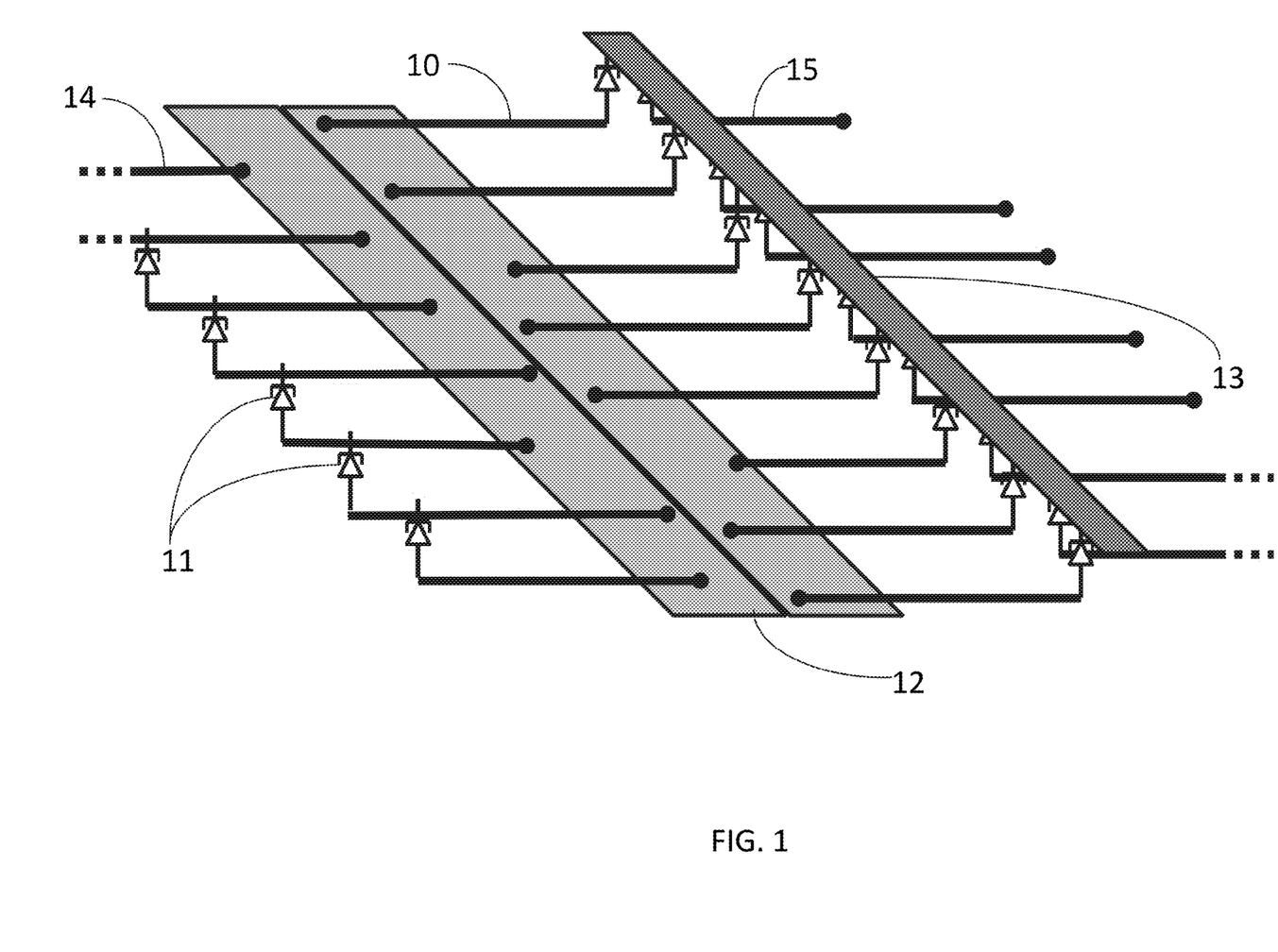
FIG. 1 is a logical diagram of an antenna array according to an aspect of the disclosure.

A logical diagram of an example of an aspect of the present disclosure is shown in FIG. 1. The core of a solar antenna array may have rows of antennas 10, separated by power lines 13 and ground lines 12. The power and ground lines may be respectively coupled to the antennas 14, 15 by tunnel diodes 11. When excited by infrared light, the current may flow through the antennas 14, 15, from the ground line to the power line, thus producing half-rectified electrical energy. It may be understood by one well-versed in the state of the art that additional circuitry, such as switching and decoupling capacitors, may be included in the periphery of the solar antenna array, as may be desired to produce stable DC power in voltages suited for commercial applications.

For antennas to efficiently receive infrared light, it may be advantageous for them to be either ¼ or ½ of the wavelength of the light being captured, depending on whether or not the antenna is coupled to an existing ground plane. In order to produce such small structures, without expensive masking operations, one may create a mold with which to manufacture the power and ground lines, and grow carbon nanotube antennas between them.

Figure 2:
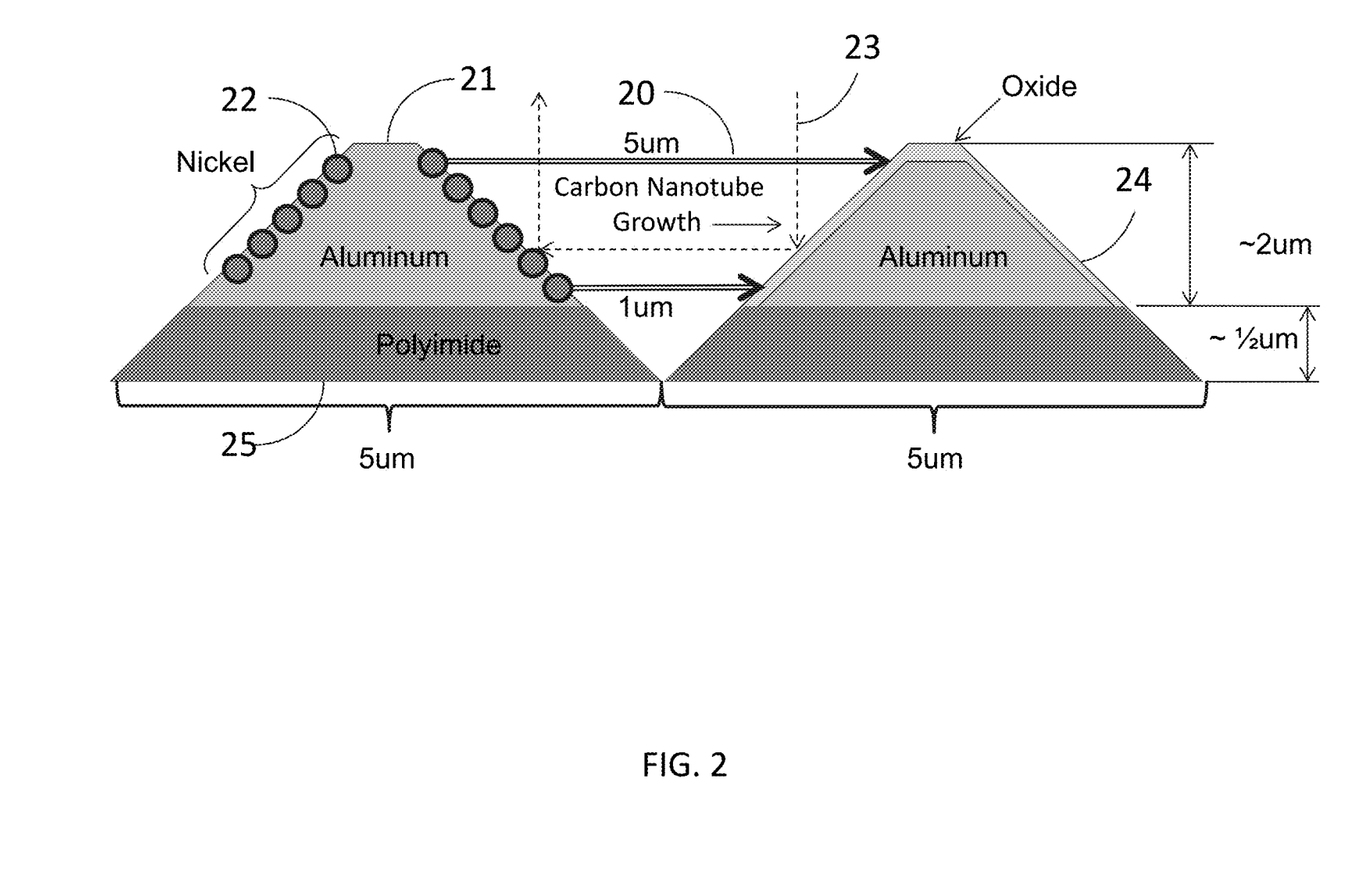
FIG. 2 is an annotated cross-section of a partially processed long-wave infrared antenna array, according to an aspect of the disclosure.

Reference is now made to FIG. 2, an annotated cross-section of a partially processed antenna array, according to an aspect of the disclosure. An antenna's efficiency to absorb electromagnetic frequencies may be significantly lower, the farther the electromagnetic frequency varies from the ideal frequency of the antenna, or the farther the electromagnetic waves are from the antenna. These effects may significantly limit the efficiency of a regular two-dimensional array of antennas with varying lengths. In order to absorb a reasonable amount of the infrared black body energy, the antennas may need to vary in lengths from at least 1 micron to 5 microns. Nanotubes may be grown to distances between 1 and 5 microns in the direction of an electric field, which may be applied between conductors containing catalytic balls. The amount of growth may be related to strength of the electric field and the density of the catalytic balls, which may be chosen to maximize the efficiency of the resulting antennas. The power and ground lines of a solar antenna array may be constructed by depositing ~2 microns of a metal, such as aluminum 21, followed by ~½ micron of an insulating polymer 25, such as a polyimide. This may be done, for example, using a mold with V-grooves that may have been constructed using an inexpensive mask with ~5 micron dimensions. The V-grooves may be coated with silicon carbide (SiC) and/or some other material that may be non-adhesive to the deposited conductor. A second metal, such as nickel 22, may either be deposited, e.g., via a sputtering technique, which may create small balls, selectively in alternating V-grooves, or selectively attached to alternating metal ridges following the removal of the structure from the mold. The resulting power and ground lines may be covered with a thin oxide layer 24, prior to growing the carbon nanotubes from the metal balls residing on one ridge across to the oxide residing on an adjacent ridge. Furthermore, it may be desirable for the angles of the ridges to be sufficient to reflect any unabsorbed infrared light back to its infrared source 23.

Figure 3:
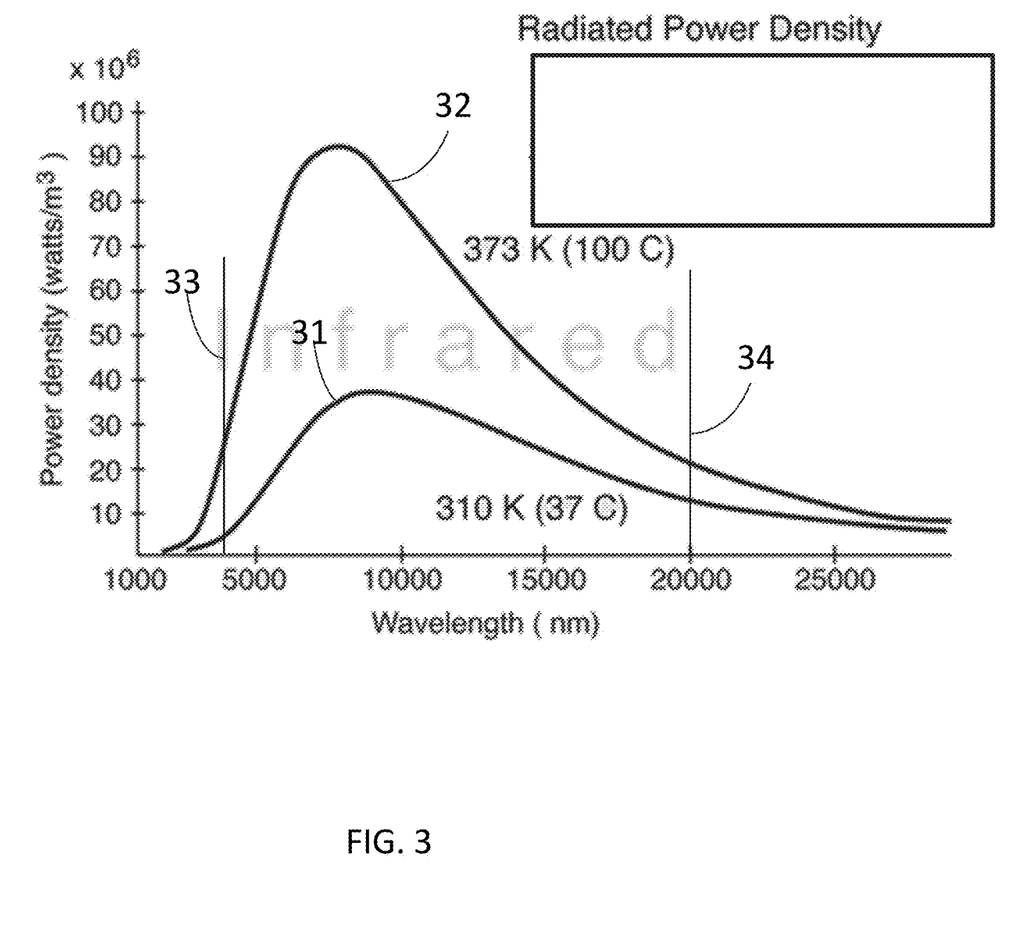
FIG. 3 is a chart containing two curves depicting the black body radiation across the infrared spectrum for an object at two different temperatures.

Reference is now made to FIG. 3, a chart containing an example of two curves depicting the black body radiation across the infrared spectrum for an object at two different temperatures. All objects that have a temperature above absolute zero (zero degrees Kelvin), emit some black body radiation, in a distribution across a range of electromagnetic frequencies. The higher the temperature of the object, the shorter the average wavelength and the higher the total energy emitted from the object. Examples of this may be seen in the power density curves for an object at either 310 degrees Kelvin 31, or at 373 degrees Kelvin 32. As may be also seen by the vertical lines in the chart, a majority of the power emitted from black bodies in this temperature range may be captured with ¼ wavelength antennas that vary from 1 micron 33 to 5 microns 34 (wavelengths between 4 and 20 microns), and a larger percentage of the total power may be captured at 373 degrees Kelvin 32 than may be captured at 310 degrees Kelvin 31.

Figure 4:
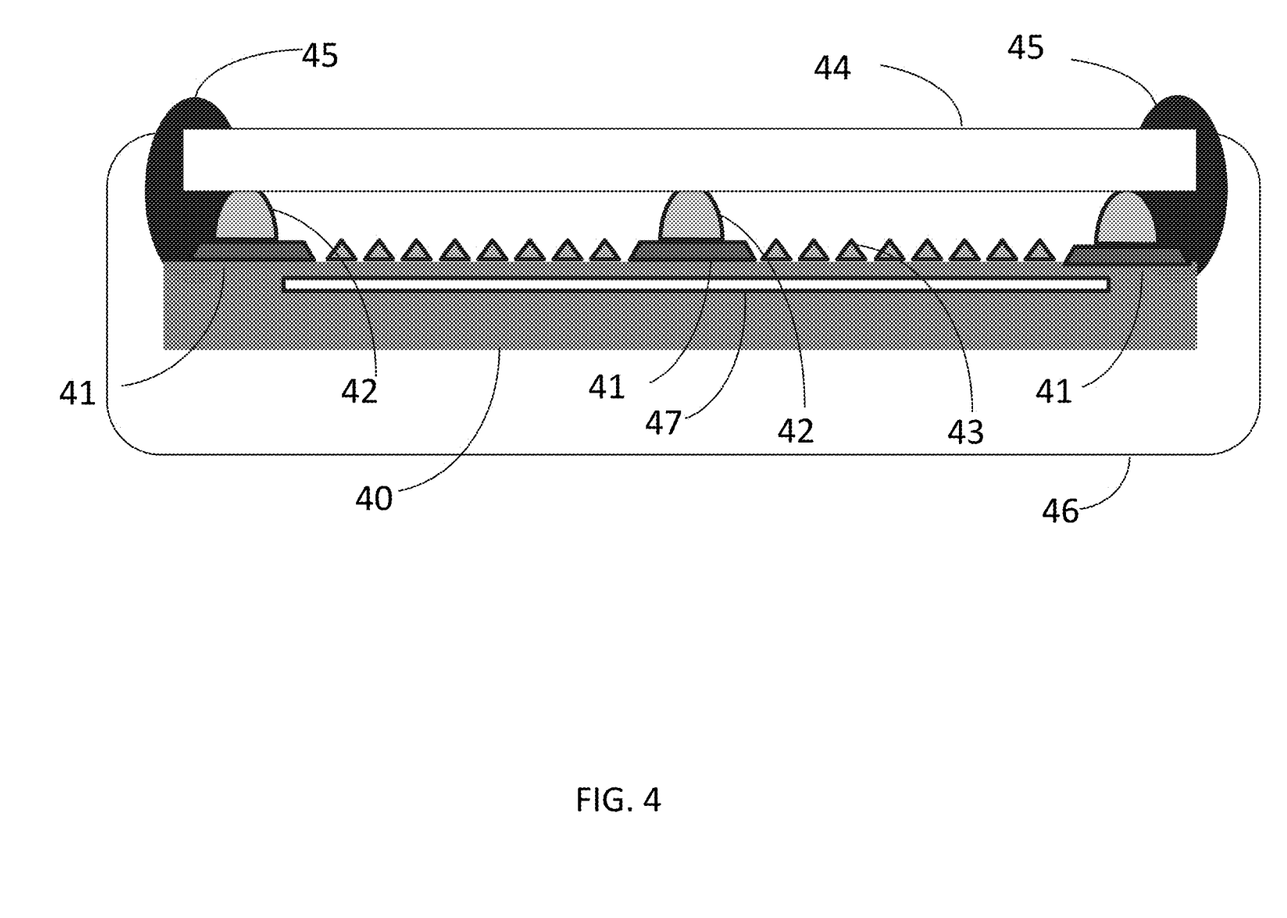
FIG. 4 is a cross-section of a completed infrared antenna array with a glass cover, according to an aspect of the disclosure.

Reference is now made to FIG. 4, a cross-section of an example of a completed infrared antenna array with a glass cover, according to an aspect of the present disclosure. Large power and ground pads 41 may be placed across the antenna array 40, over which may be added polyimide or adhesive posts 42 between the power and ground lines 43 on the infrared antenna array 40. These posts 42 may support a transparent glass (or other material sufficiently transparent to permit light to pass through) plate 44, which may be placed to protect the antenna array. Sealing material 45 may be applied to seal the antenna array 40 to the glass plate. It is further contemplated that the glass plate 44 may be composed of one or more layers of high-gain low-e glass, such that external light may be efficiently transmitted to the infrared solar array in a way that the unconverted electromagnetic energy and waste heat may be repeatedly reflected off the power and ground ridges 43, the aluminum lines 47 below the antennas, and the low-e glass 44 above, to eventually be converted by the rectifying antennas or lost via waste heat. To minimize this waste heat, the entire structure may be encapsulated in some insulating material 46. While this may eventually collect long-wave infrared energy, neither the aluminum nor the low-e glass will efficiently convert the visible light, which may be largely lost.

Figure 5:
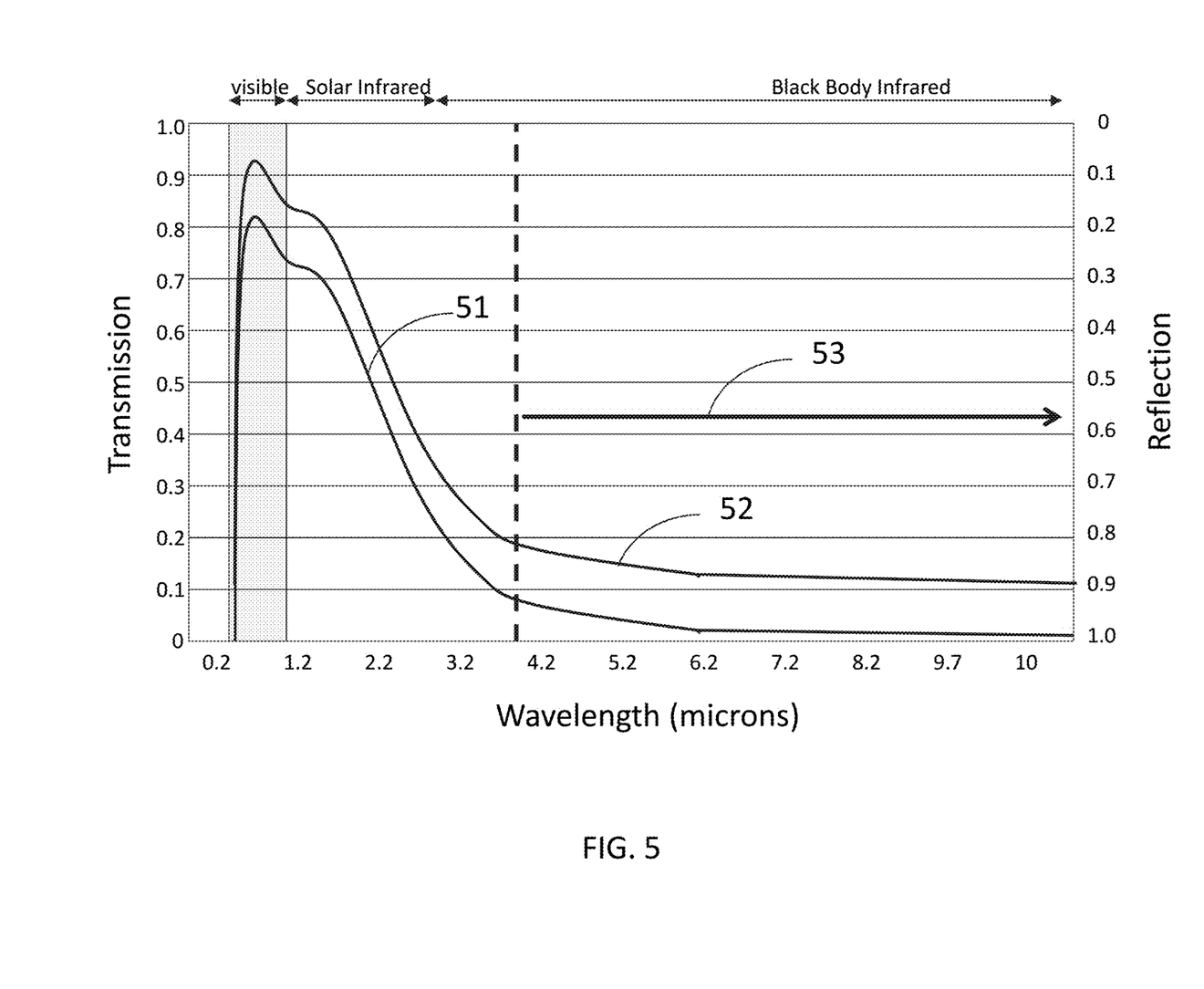
FIG. 5 is a chart of an example of the transmission characteristics of a high-gain low-e glass from the visible through a portion of the black body infrared spectrum.

Reference is now made to FIG. 5, a chart of the transmission characteristics of an example of high-gain low-e glass from the visible through a portion of the black body infrared spectrum. The curve 51 depicts the transmission and curve 52 the corresponding reflection of an example of a typical high-gain low-e glass. The difference between transmission and reflection may be absorbed by the glass, some of which may be emitted back toward the infrared antenna array. Unlike clear glass, low-e glass may have a very high reflection index for wavelengths of black body radiation, particularly the wavelengths 53 being captured by the infrared antenna array. It may, therefore, be desirable to convert visible light transmitted through the high-gain low-e glass into black body radiation, which may help to maximize the subsequent retention of the energy.

According to another aspect of the present disclosure, a thermal emitter plate may be constructed between a plate of high-gain low-e glass and an infrared antenna array, such that the visible light transmitted through the high-gain low-e glass may be captured and emitted as infrared black body radiation by the thermal emitter plate, which in turn may be reflected back to the emitter plate by the high-gain low-e glass above, and may be collected by an infrared antenna array below.

Figure 6:
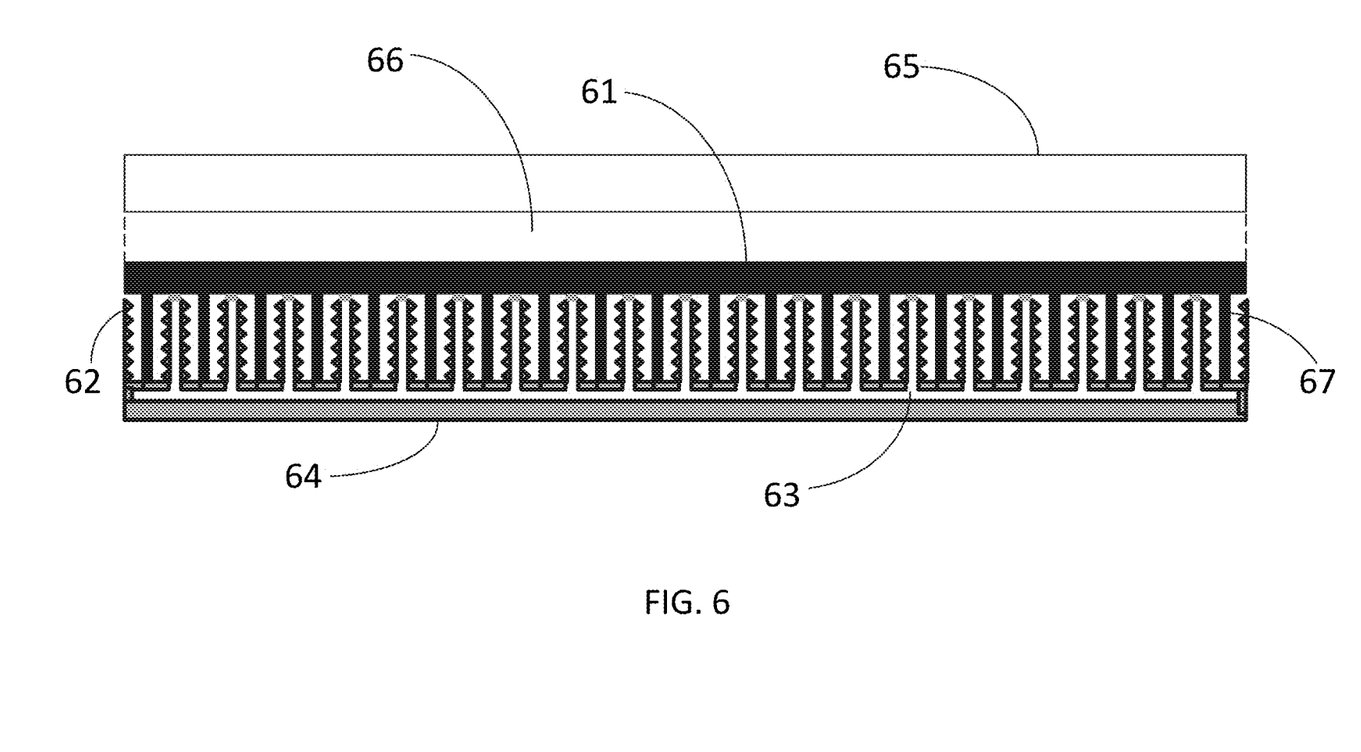
FIG. 6 is a cross-section of a portion of an infrared antenna array, according to an aspect of the disclosure.

Reference is now made to FIG. 6, a cross-section of a portion of an example of an infrared antenna array, according to an aspect of the disclosure. An air gap 66 may exist between high-gain low-e glass 65 above a thermal emitter plate 61, which may collect the transmitted visible light and emit it as black body infrared to the antenna array 62 below the emitter plate 61. The electric power may be drawn from metal power and ground lines 63 below the antenna array, and backed by a thick layer of plastic (not shown). The metal power and ground lines, which may be composed, e.g., of aluminum and copper, may also reflect unconverted energy back to the emitter plate and antenna array. The emitter assembly may be composed, e.g., of carbon or a carbon composite and may include "heat fins" 67 and emitter plate 61. The fins 67 may be surrounded by the antenna array, such that the emitter plate 61 may emit infrared energy over a much larger area than may be used to collect the visible light through the high-gain low-e glass 65 above the emitter plate 61.

Figure 7:
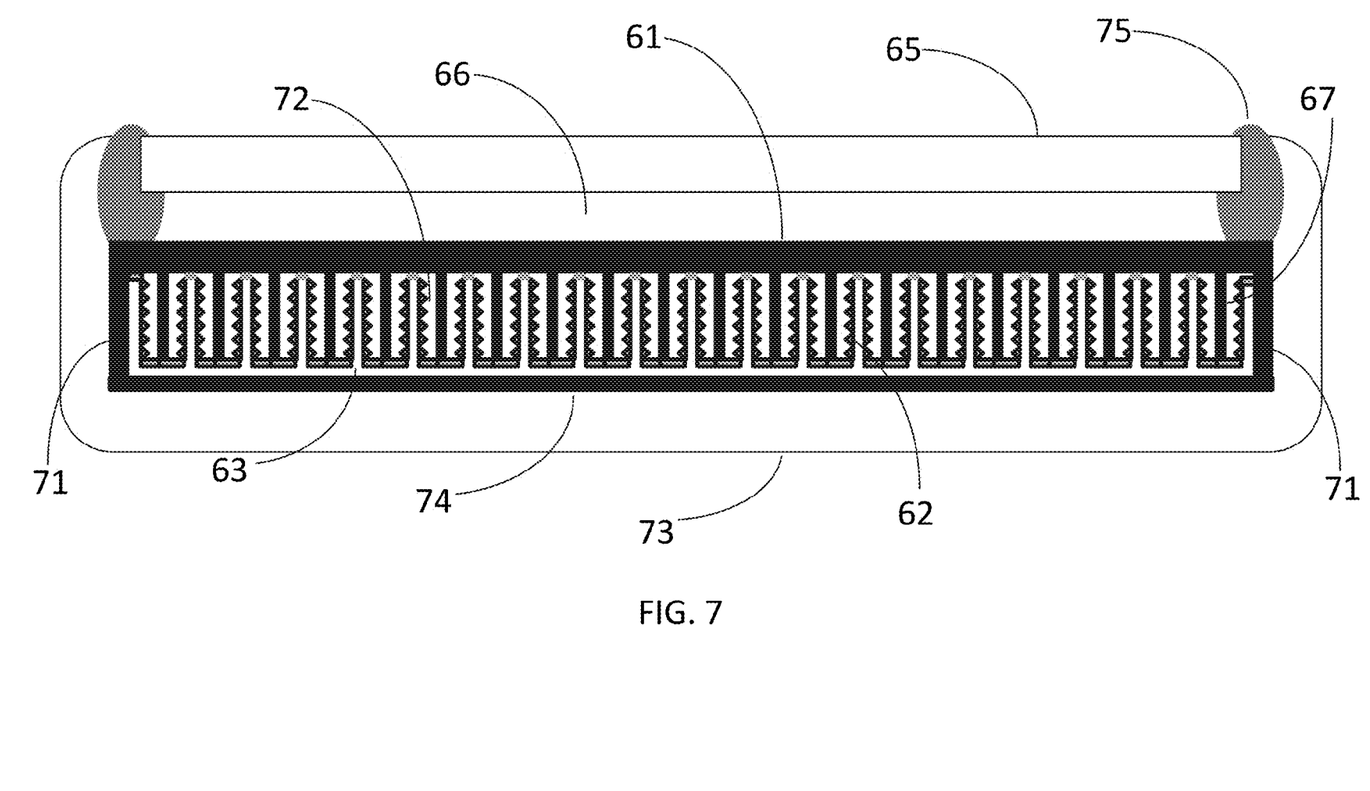
FIG. 7 is a complete cross-section of the infrared antenna array shown in FIG. 6.

Reference is now made to FIG. 7, a complete cross-section of the example infrared antenna array shown in FIG. 6. A number of improvements may be applied to further reduce the heat losses out to the external environment by: first, using a sealing material 75, which may be sufficiently hermetic to keep the external atmosphere out of the gas in the air gap 66, which in turn may be composed of a gas or gasses, such as helium and/or argon, which may have a minimal heat transfer properties; second, the emitter plate 61 may be extended 71, 74 to contact the power and ground lines, which may recycle the waste heat from the antenna array conducted through the power and ground lines; and third, insulation 73 may be place around the entire assembly (without covering glass 65).

To maintain a reasonable internal operating temperature while minimizing the heat losses to the external environment, the device may need to convert as much of the retained heat into electricity as may be introduced through the high-gain low-e glass. To do this, it may be necessary to collect the energy from a larger area of the emitter assembly than is exposed to visible light. One way to increase the effective area of the antenna array 62, which may be less than ½ millimeter thick, may be to fold the antenna array 62 around the emitter fins 67 and, for stability, to connect it to the emitter plate 61 between each of the fins 67. The ratio of the area of the antenna array to the area of the top of the emitter plate 67, which is the area exposed to visible light through the high-gain low-e glass, may be sufficiently larger than the inverse of the efficiency of the antenna array to compensate for both the antenna array's limited range of black body radiation collection and the inefficiency of the collection, which may thereby help to maximize the electrical output while keeping the thickness of the entire structure under a centimeter.

Figure 8:
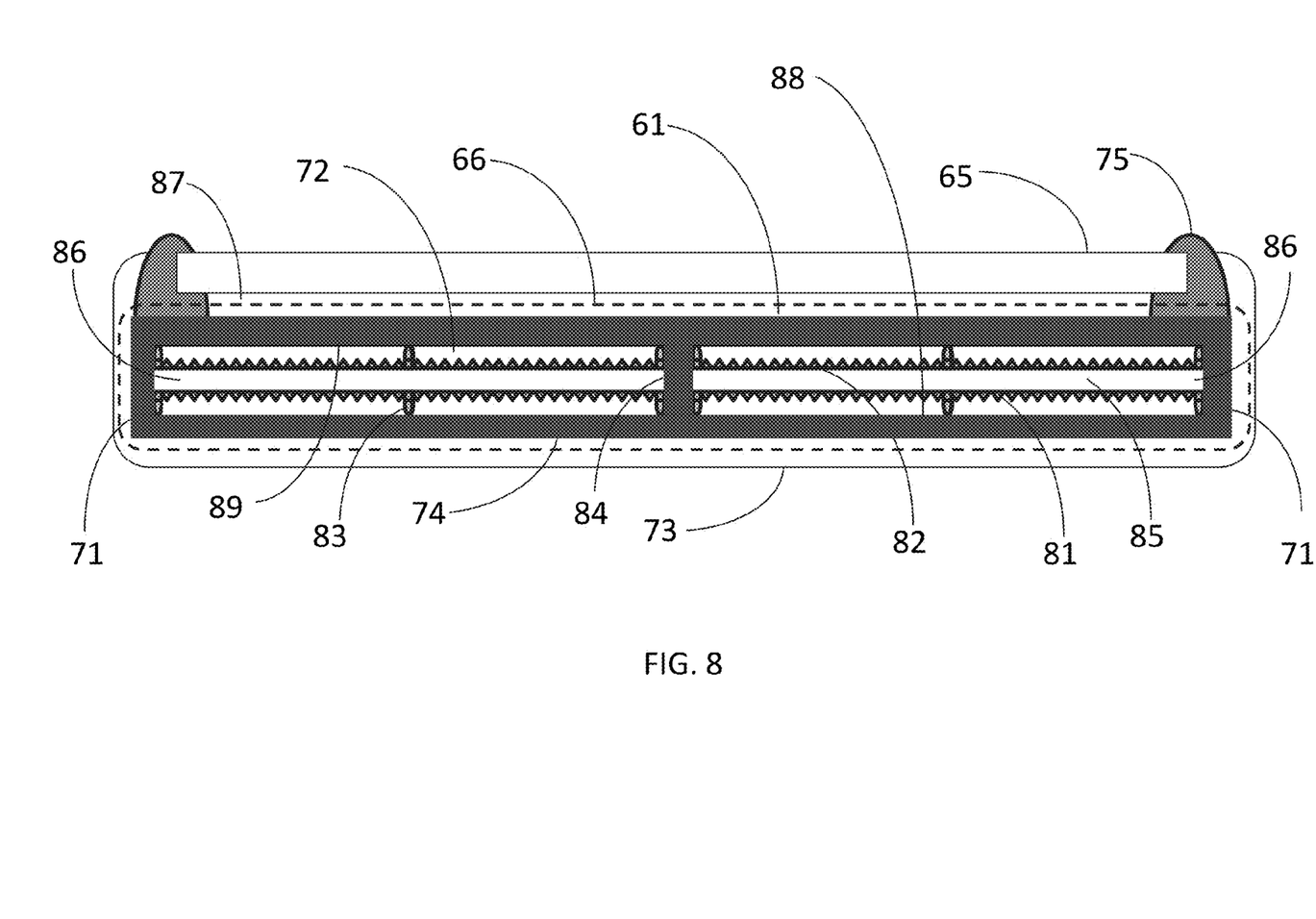
FIG. 8 is another cross-section of an infrared antenna array, according to an aspect of the disclosure.

Folding the antenna array 62 around the emitter fins 67 may add significant cost and yield loss to the manufacture of the array assembly, so according to another aspect of the present disclosure, the emitter plate 61 with extensions 71 and 74, may encase two antenna arrays 81,82, an example of which is shown in FIG. 8. The antenna arrays 81 and 82 may be separated from the emitter plate 61 and the extension 74 by posts 83, and may have thin film metal power and ground lines 85 sandwiched between the antenna arrays 81 and 82. Excess heat not reflected back to the emitter plate 61 and the bottom extension 74 from the thin film metal lines 85, may be conductively transferred at the ends 86 of the thin film metal lines to the side extensions 71. In order to improve the structural integrity of the emitter assembly and the heat transfer from the thin film metal lines, additional extensions 84 may be connected between the emitter plate 61 and the bottom extension 74. In both FIGS. 7 and 8, the gap 72 between portions of the antenna array and emitter assembly may be filled with a gas that may improve the conversion of the infrared radiation into electricity.

It is further contemplated that the emitter's surfaces 88 and 89 facing the antenna arrays 81 and 82 may be patterned, which may increase its effective emitting area.

Figure 9:
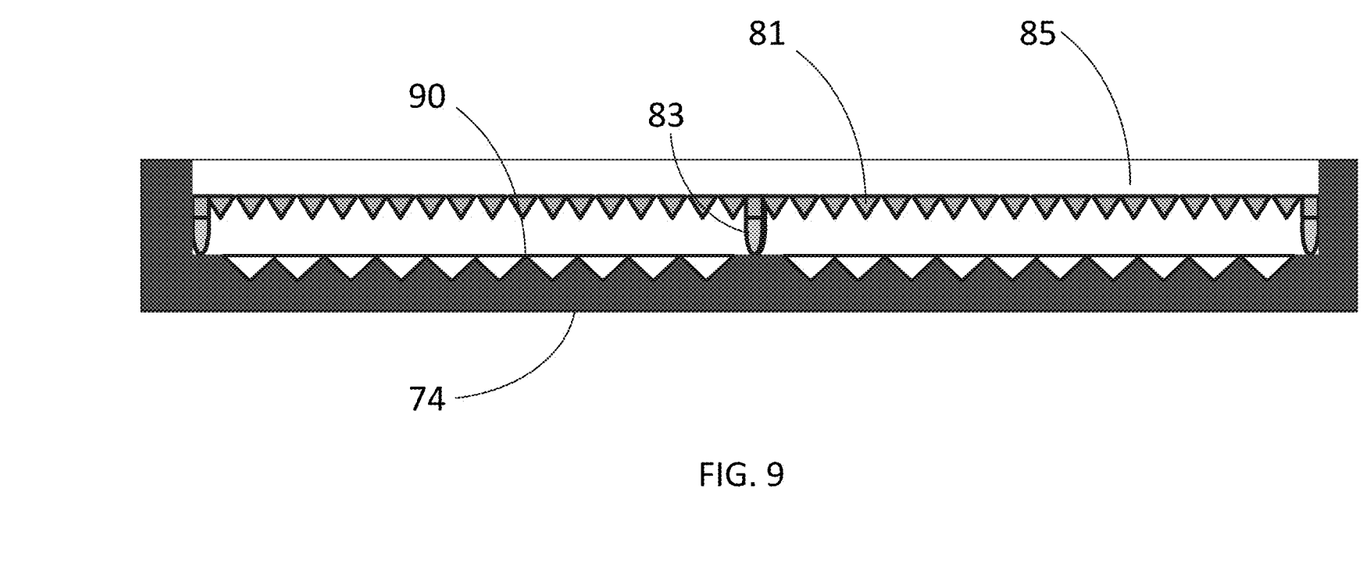
FIG. 9 is a cross-section of a portion of an infrared antenna as in FIG. 8 with a patterned emitter, according to an aspect of the disclosure.

Reference is now made to FIG. 9, a cross-section of a portion of the example of an infrared antenna as in FIG. 8, with a patterned emitter. In this case, the emitter 74 may have an array of pyramids 90, each of which may have 45 degree sides cut into the surface of the emitter. As such, most of the infrared emissions that may be emitted perpendicular to the the surfaces of the pyramids may be transmitted to the antenna array 81. As a result, the emitting surface area may be over 40% greater than the flat surface area 88 in FIG. 8, which may result in similar increases in electricity production.

It is further contemplated that multiple emitter assemblies 87 may be stacked below the one shown in FIG. 8, but within the insulation 73, in a manner that may allow any economically reasonable ratio of the antenna array area to the top emitter plate array.

It is also contemplated that a black body infrared antenna array may be coupled to a visible light antenna array in a manner that may capture and convert the waste heat generated by the visible light antenna array.

Figure 10:
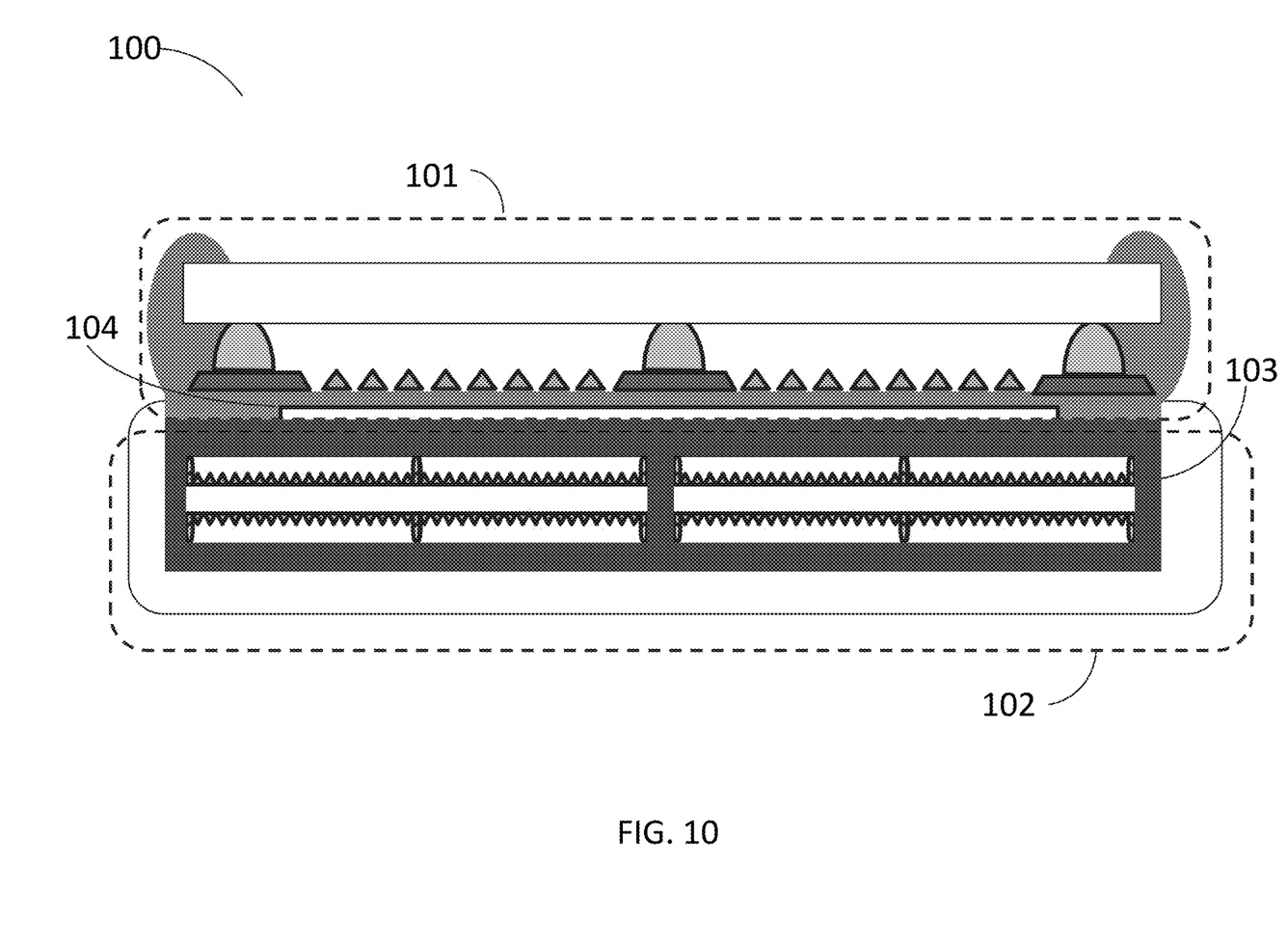
FIG. 10 is a cross-section of the infrared antenna array shown in FIG. 8, coupled with a visible light antenna array, according to an aspect of the disclosure.

Reference is made to FIG. 10, a cross-section of the infrared antenna array shown in FIG. 8, coupled with an example of a visible light antenna array. A visible light antenna array 101, e.g., as described in U.S. patent application Ser. No. 14/701,765, may be concatenated to an infrared antenna array 102, e.g., as may be seen in FIG. 8, such that the thin metal power and ground lines 104, which may dissipate the excess heat from the visible light antenna array 101 may be connected to the emitter 103 in the infrared antenna array 102, which may function to transfer the waste heat for further conversion into electricity.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

We claim:

1. An antenna array configured to convert solar energy into electrical power, comprising:
   a high-gain low-e glass plate;
   uniformly, horizontally-spaced alternating power and ground sloped metal ridges disposed on a plastic base, wherein the horizontal spacing is in a first direction;
   carbon nanotube antennas of randomly varying lengths connected between the power sloped metal ridges and ground sloped metal ridges;
   thin film metal power lines under the plastic base connecting the power sloped metal ridges together; and
   thin film metal ground lines under the plastic base connecting the ground sloped metal ridges together;
   wherein the power and ground sloped metal ridges are aligned in a second direction, perpendicular to the first direction, and are sloped with respect to respective planes extending in a third direction perpendicular to a plane formed by the first and second directions; and
   wherein visible light is transmitted to the antennas through the high-gain low-e glass plate, and wherein the antennas are designed to capture black body infrared radiation reflected between the high-gain low-e plate and the thin film metal power lines and thin film metal ground lines.

2. The antenna array as in claim 1, wherein the carbon nanotube antennas are randomly connected with known distributions of lengths and directions.

3. The antenna array as in claim 1, wherein the carbon nanotube antennas are each connected to the power sloped metal ridges by respective metal-oxide-carbon diodes.

4. The antenna array as in claim 1, wherein the carbon nanotube antennas are each connected to the power sloped metal ridges by respective point contact diodes.

* * * * *